(12) United States Patent
Passerini et al.

(10) Patent No.: US 8,644,079 B2
(45) Date of Patent: Feb. 4, 2014

(54) METHOD AND CIRCUIT TO DISCHARGE BIT LINES AFTER AN ERASE PULSE

(76) Inventors: Marco Passerini, Lozza (IT); Simone Bartoli, Mandello del Lario (IT); Osama Khouri, Bellano (IT)

(*) Notice: Subject to any disclaimer, the term of this patent is extended or adjusted under 35 U.S.C. 154(b) by 338 days.

(21) Appl. No.: 13/104,722

(22) Filed: May 10, 2011

(65) Prior Publication Data

US 2012/0287723 A1 Nov. 15, 2012

(51) Int. Cl.
*G11C 11/4063* (2006.01)
(52) U.S. Cl.
USPC .................................................. 365/185.25
(58) Field of Classification Search
USPC .................................................. 365/185.25
See application file for complete search history.

(56) References Cited

U.S. PATENT DOCUMENTS

| | | | | |
|---|---|---|---|---|
| 5,402,382 A | * | 3/1995 | Miyawaki et al. | 365/218 |
| 5,521,866 A | * | 5/1996 | Akaogi | 365/185.29 |
| 5,907,506 A | * | 5/1999 | Jinbo | 365/185.29 |
| 2002/0091893 A1 | * | 7/2002 | Kaya et al. | 711/100 |
| 2008/0123434 A1 | * | 5/2008 | Kuriyama et al. | 365/185.29 |

* cited by examiner

*Primary Examiner* — Hoai V Ho
*Assistant Examiner* — Jay Radke (57) ABSTRACT

Disclosed here in a method that comprises performing an erase operation on multiple cells in a memory device, the performing comprising applying an erase voltage to the multiple cells, bit lines coupled to the multiple cells being thereby charged up; and discharging the bit lines by coupling the bit lines to a discharging line through a DC path.

24 Claims, 12 Drawing Sheets

METHOD AND CIRCUIT TO DISCHARGE BIT LINES AFTER AN ERASE PULSE

FIELD OF THE DISCLOSURE

This disclosure generally relates to techniques and circuits for a flash memory as a nonvolatile memory device, and more particularly to an erase operation in a flash memory.

BACKGROUND

Flash memories are non-volatile read-write memory devices. Flash memories can be used in various electronic devices, such as mobile-phones, computers, digital cameras, MP3 players and the like. A flash memory can include multiple flash cells. A flash cell can include a control-gate transistor and a floating-gate transistor. Typically, each flash cell retains a single bit of information.

There are various types of flash cell technology. In one such technology, flash cells are arranged in matrix structures. A matrix is an arrangement of flash cells including multiple bit lines and multiple word lines. Different types of flash memory can be obtained based on the particular matrix configuration. For example, NOR flash memory or NAND flash memory can be obtained depending on the manner in which flash cells are connected to bit lines within the matrix. Exemplary matrix configurations of a NOR flash memory and a NAND flash memory are depicted in FIGS. 1($a$) and 1($b$), respectively.

Figure 1A:
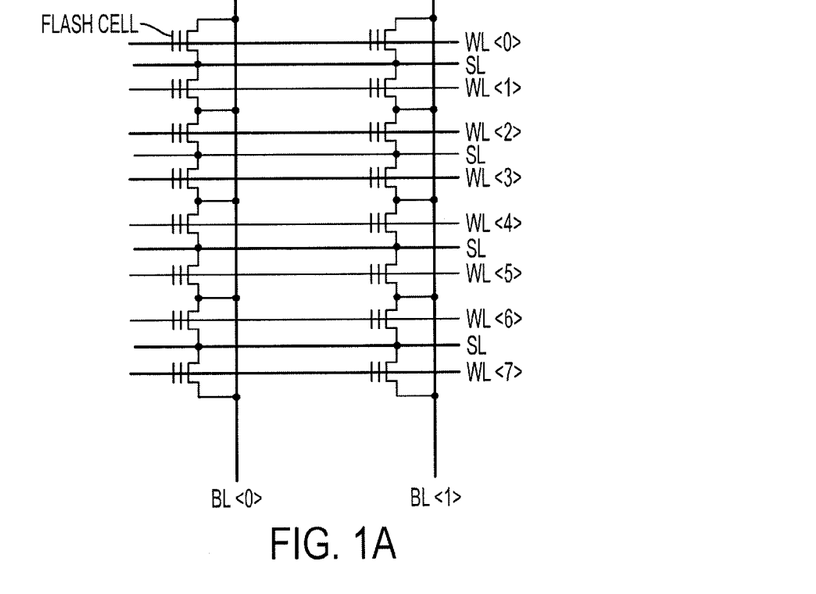
FIG. 1(a) illustrates an example of a NOR flash memory.

FIG. 1($a$) shows an exemplary NOR flash memory matrix arrangement. For simplicity, only eight word lines and two bit lines are depicted in FIG. 1($a$). In this matrix, flash memory gate terminals are connected to word lines (WL<0> through WL<7>), drain terminals are connected to bit lines (BL<0> and BL<1>), and source terminals are, connected to a common source line (SL).

Figure 1B:
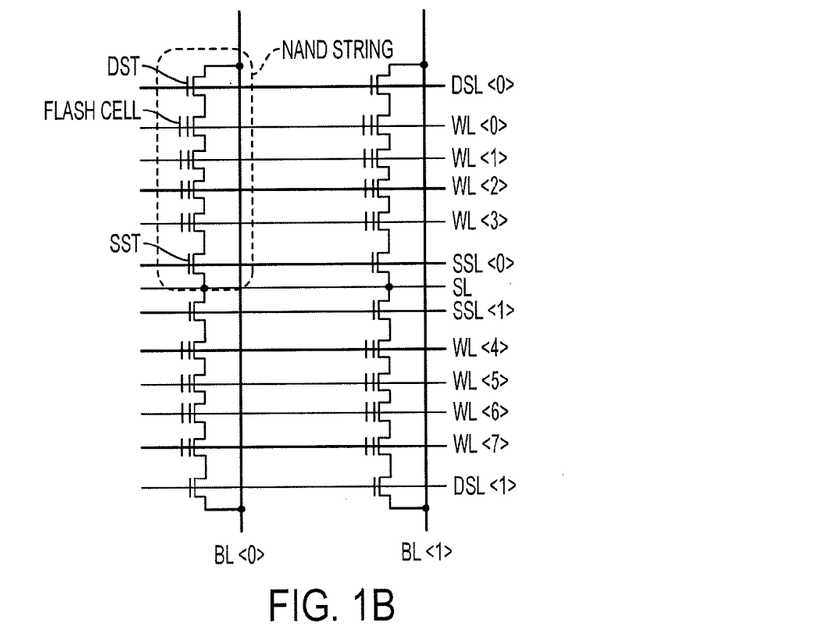
FIG. 1(b) illustrates an example of a NAND flash memory.

FIG. 1($b$) shows an exemplary NAND flash memory matrix arrangement. Again, for simplicity, only eight word lines and two bit lines are depicted in FIG. 1($b$). Flash cells are grouped into so-called strings or blocks of cells. An individual string/block (hereinafter referred to as "string") is a group of several flash cells connected in series. In this example, a string is indicated by the dotted line and includes four flash cells. Drain terminals of the string are connected to bit lines (BL<0> and BL<1>) through a drain selector transistor (DST), and source terminals of the string are connected to a common source line (SL) through a source selector transistor (SST). Gate terminals of the flash cells are connected to word lines (WL<0> through WL<7>), and gate terminals of the selector transistors are connected to selector lines (DSL<0>, DSL<1>, SSL<0>, and SSL<1>).

In both flash architectures, as shown in FIGS. 1($a$) and 1($b$) for example, a p-well bulk region, which is a p-type semiconductor well, can be common to (i.e., shared by) multiple flash cells and/or multiple strings. If the p-well bulk region includes all of the flash cells in the memory, then the memory is considered to be a single-plane flash. If some flash cells are drawn in different p-well bulk regions, then the memory is usually considered to be a multi-plane flash.

During use of a flash memory, the various flash cells will typically need to be erased. Erasure of multiple flash cells in both NAND and NOR flash memory can be accomplished by exploiting the Fowler-Nordheim (FN) tunnel effect. The FN tunnel effect permits the extraction of charge stored in flash cells (thereby erasing them) by applying a high voltage difference between the p-well bulk region and the gate of the cell. This causes the flash cells to assume a high voltage, equivalent to a binary "1," which can correspond to an erase state of the cells.

In NAND matrix and in some NOR matrix flash memories this can be achieved by raising the p-well bulk region to a high voltage value (such as 15V or more, for example) and keeping grounded the word lines or group of word lines of the cells to be erased. All other word lines (i.e., those of cells not to be erased) are left floating. Accordingly, when the p-well bulk region is raised to a high value, only those flash cells located along word lines kept to ground or to a low potential voltage are erased. This is because a high voltage difference is developed between their p-well bulk region(s) and gate terminals, thus permitting the FN tunnel effect to take place. In contrast, because the other word lines are left floating, they are coupled to the high erase voltage. Accordingly, a zero voltage difference is developed between the p-well bulk region(s) and gate terminals of the flash cells along these word lines, thus inhibiting the FN tunnel effect.

During an erase pulse, that is, during the erase phase in which the p-well bulk region is raised to a high voltage, the common source line can be shorted to the p-well bulk region. An electronic component such as a switch circuit can be used to short the p-well bulk region and the common source line. However, the bit lines can be left floating to avoid cell damage and p-n junction breakdown.

Figure 2:
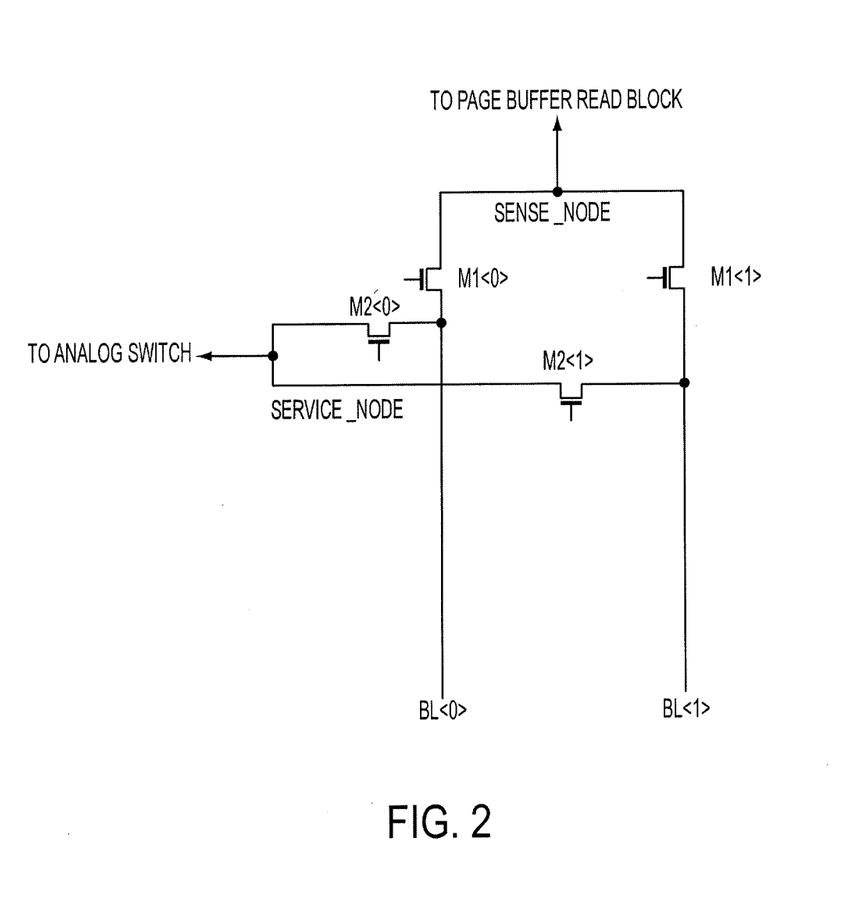
FIG. 2 illustrates an example of an interface between bit lines and other circuits for a NAND flash memory.

FIG. 2 shows an exemplary circuit that can be used in NAND flash memory to interface bit lines with a page buffer read block and other circuits. For simplicity, only two bit lines are depicted in FIG. 2. A typical flash memory will have many more bit lines. As can be seen, there are two paths through the interface circuit. The first path, through transistors M1<0> and M1<1>, connects the bit lines to SENSE_NODE. SENSE_NODE can be a low-voltage sensing node for the page buffer. The second path, through transistors M2<0> and M2<1>, connects the bit lines to SERVICE_NODE. SERVICE_NODE can be used for several different purposes, such as pre-charging bit lines during read or program, or shielding a read bit line from adjacent read bit lines during read or verify. SERVICE_NODE can be connected to an analog switch to allow biasing at the desired voltage level.

The transistors shown in FIG. 2 can be high-voltage transistors, meaning that they can sustain a high voltage difference between their terminals. Gate connections are not depicted in FIG. 2 for simplicity. During an erase pulse, all the bit lines can be left floating by driving the gate terminals of the interface transistors M1<0>, M1<1>, M2<0> and M2<1> to ground or to a low voltage level. Since the bit lines are left floating during an erase pulse, all the bit lines rise to the same voltage that is applied to the p-well region.

This rising of the bit lines can be caused by two effects. First, the p-well bulk region, the non-erasing word lines, and the common source-line strap can be capacitively coupled to bit lines. (The common source-line strap is a grid of metal lines connecting source line taps. These metal lines are typically drawn with a higher metal level than the bit lines.) Second, the p-n junctions corresponding to the contacts of the bit lines can be forward biased, thus permitting the flow of current. These two effects are described in more detail below with reference to FIG. 3.

Figure 3:
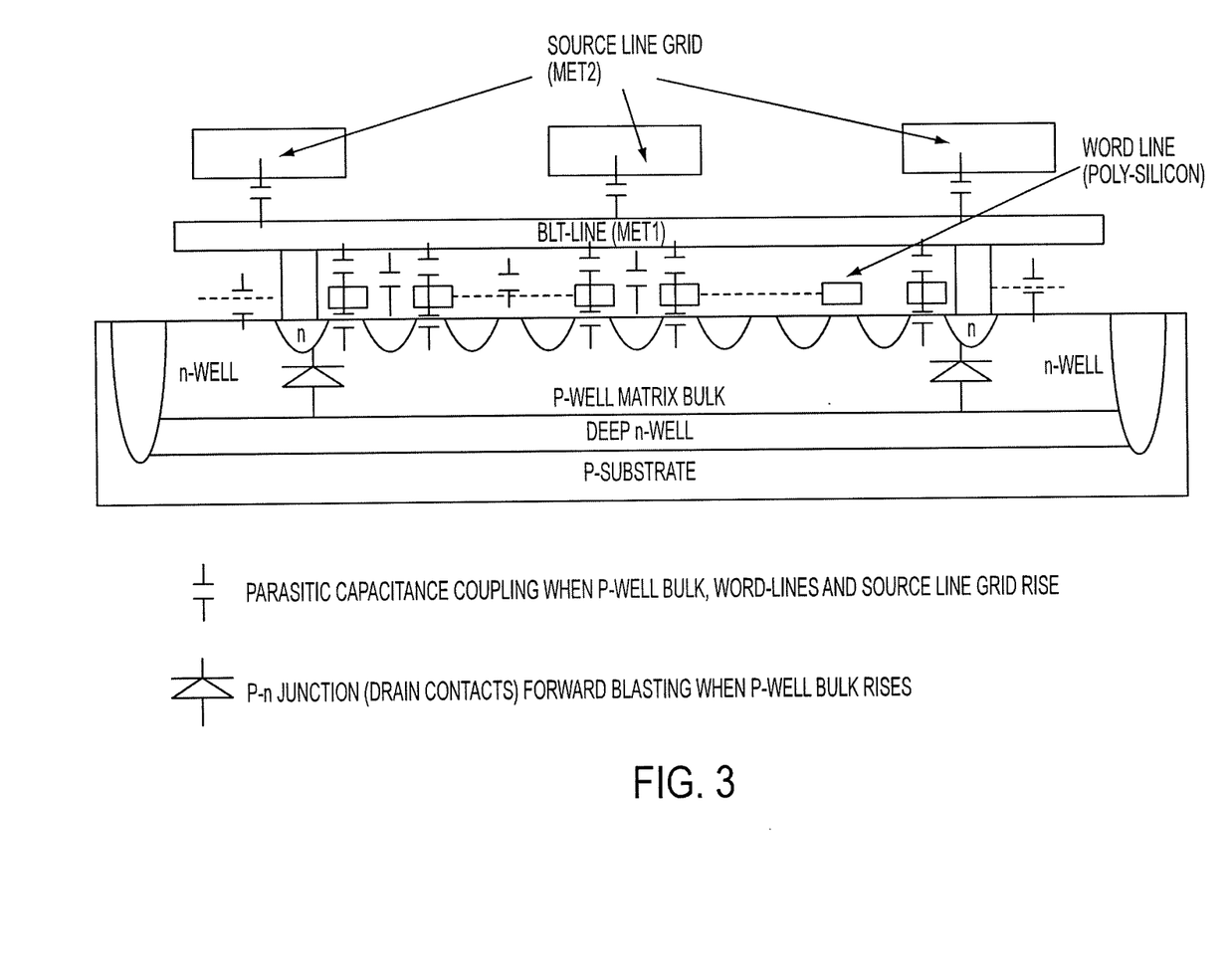
FIG. 3 illustrates an example of a NAND flash memory matrix, diagrammed along the bit-line direction. Parasitic effects resulting in bit-line rise during an erase pulse are depicted.

FIG. 3 shows a section of a NAND flash memory matrix along the bit-line direction. The p-well bulk region (P-well matrix bulk) is separated from the p-well substrate (p-substrate) of the chip by means of deep-n-well diffusion. The deep n-well is usually shorted to the p-well bulk region. The word lines can be made of polysilicon, the bit lines can be made of a first metal (MET1), and the common source line grid can be made of a second metal (MET2).

As stated above, FIG. 3 illustrates the two effects that ensure the rise of the floating bit lines during the erase pulse. The capacitive coupling is represented by the parasitic capacitance elements and the forward biasing of the contact junction is represented by the parasitic p-n junction diodes. Note, however, that the parasitic capacitive coupling between bit lines and the grounded word lines to be erased does not contribute to the rising of the bit lines.

In prior methods, when the erase pulse is finished, the p-well bulk region and common source line are discharged together by means of a discharger circuit. The bit lines, on the other hand, are discharged only by the capacitive coupling effect. Since the contact junctions of the bit lines are reverse biased during discharge, they only contribute to the bit-line discharge with their reverse bias parasitic capacitance.

The present inventors have recognized that at the end of the discharge process in the erase operation, while the value of the bit lines is generally low, the precise value is unknown and can actually be considerably higher than ground. In addition, if capacitive coupling between the p-well bulk region and the bit lines is not efficient during discharge, there is a risk of triggering unwanted junction breakdown due to a possible voltage difference that can build up between the p-well bulk region and the bit lines.

The inventors have also recognized that these drawbacks can be exacerbated when multiple word lines or multiple blocks are erased simultaneously. In these circumstances, the capacitive coupling might be weaker because many word lines are biased to ground and thus may shield the capacitive coupling effect from the p-well bulk region to the bit lines. While this might not impact the rising of the bit lines since that effect can occur by the forward biasing of the p-n contact junction, it can have a negative impact during the discharge phase when bit line discharge is done solely by capacitive coupling. All of these problems can lead to damage or premature aging of the flash cells and/or interface transistors. This can have a negative influence on the reliability, endurance, and retention capabilities of the flash memory.

SUMMARY

Methods and circuits to achieve better discharge of bit lines in a memory, particularly after an erase pulse in a flash memory, are described as a part of a data erase operation. In an embodiment, better discharge can be accomplished by adding a discharge path that assists in pulling the bit lines down to a desired voltage. The bit lines can be connected to the discharge path by means of transistors, particularly high voltage nMOS transistors. During development of the erase pulse, the gates of the transistors can be driven to a predetermined intermediate voltage. This can be useful because these transistors connect the bit lines to a common node that is left floating during this time. When the erase pulse is finished and the p-well bulk region begins discharging, a discharger circuit can be activated on the common node previously left floating and a bit-line discharge path can thus be enabled. The activation of the discharge circuit for bit-line may be carried out substantially simultaneously with, or after, or before discharging the p-well bulk region. The bit-line can be thus discharged through a DC (direct current) path. This DC path cab includes a switch such as a transistor that is controlled to be in a conductive state.

By virtue of this technique, bit-line discharge can continue, even after p-well discharge ends, up to a desired low value voltage that can be as close to ground as desired. In contrast, previous discharge techniques relying only on capacitive coupling allow the bit lines to discharge only while the p-well bulk region is discharging. Furthermore, the final value of the bit lines is not known and can be higher than ground when using prior techniques.

Additionally, the circuits and techniques disclosed herein can ensure an efficient bit-line discharge even when multiple word lines or strings are erased simultaneously. Moreover, discharging the bit lines together with the p-well bulk region of the matrix array can protect against the possibility of triggering junction breakdown and can avoid reliability issues due to a weak coupling effect between the p-well bulk region and the bit lines. Furthermore, word-line discharge for the erase-inhibited strings can be improved with the disclosed techniques.

In an embodiment, direct discharge of the p-well bulk region is not necessary. For example, a discharger circuit can be activated on only the common node previously left floating, thus enabling a bit-line discharge path. The p-well bulk region in turn can be discharged as a consequence of forward biasing of the p-n contact junction.

Additionally, various sensing techniques to determine when both the bit-line voltage and the p-well bulk region voltage are below a desired low voltage level are disclosed.

In an embodiment, a method for discharging bit lines in a memory device can include erasing multiple cells in the memory device, discharging a p-well bulk region and a source line associated with the multiple cells through a first discharge path using a first discharger circuit, and discharging a bit line associated with the multiple cells through a second discharge path using a second discharger circuit.

In an embodiment, the method can further include determining whether a voltage of the second discharge path is lower than a predetermined voltage using a sensing circuit. The method can further include ending the discharge steps when it is determined that the voltage of the second discharge path is lower than the predetermined voltage.

In an embodiment, the method can include shorting the second discharge path with the first discharge path when it is determined that the voltage of the second discharge path is lower than the predetermined voltage. After shorting the second discharge path with the first discharge path, it can be determined whether the voltage of the second discharge path is lower than the predetermined voltage using the sensing circuit. The method can then include ending the discharge steps when it is determined that the voltage of the second discharge path is lower than the predetermined voltage after shorting the second discharge path with the first discharge path.

In an embodiment, the method can include continuing the discharge steps until it is determined that the voltage of the second discharge path is lower than the predetermined voltage after shorting the second discharge path with the first discharge path.

In an embodiment, the method can include performing the above steps for the first discharge path instead of for the second discharge path.

In an embodiment, the method can include determining whether a voltage of the first discharge path and a voltage of the second discharge path are lower than a predetermined voltage. Two or more sensing circuits can be used. For example, a first sensing circuit can sense the voltage of the first discharge path and a second sensing circuit can sense the voltage of the second discharge path. The discharge steps can be ended when it is determined that the voltage of the first discharge path and the voltage of the second discharge path are each lower than the predetermined voltage.

DETAILED DESCRIPTION

In the following description of embodiments, reference is made to the accompanying drawings which form a part hereof, and in which it is shown by way of illustration example embodiments in which the invention may be practiced. It is to be understood that other embodiments may be utilized and structural changes may be made without departing from the scope of the invention. In addition, the various currently-available technologies, hardware, circuits, systems, methodologies, techniques, etc., described in this application are identified only as examples that can be used to accomplish or perform a particular task or achieve a particular result. Numerous other technologies, hardware, circuits, systems, methodologies, techniques, software, etc., are available or can be designed by one of ordinary skill in the art to perform the various tasks and achieve the particular results, and these are included within the scope of this application.

Figure 4:
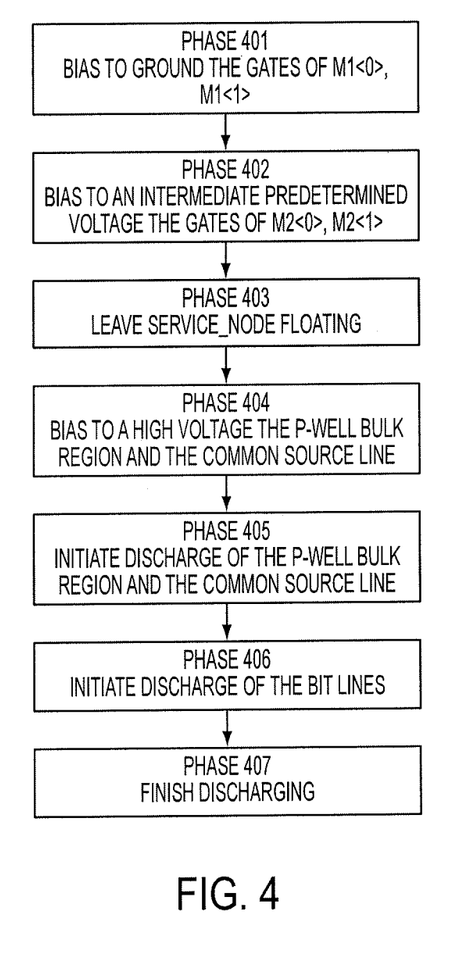
FIG. 4 illustrates an exemplary erase and discharge method according to an embodiment.

An exemplary erase and discharge method is illustrated in FIG. 4, which is performed on a flash memory as an erase operation according to an embodiment of the present invention. This exemplary method is described first briefly with reference to FIG. 2, and then in more detail with reference to FIG. 5. It should be noted that other operations such as read, write and verify operations are carried out on the flash memory in addition to the erase operation.

In phase 401, the gates of transistors M1<0> and M1<1> connecting bit lines to SENSE_NODE can be biased to ground in order to disconnect the page-buffer circuit from the bit lines BL<0> and BL<1>. In phase 402, the gates of transistors M2<0> and M2<1> connecting bit lines to SERVICE_NODE can be biased to an intermediate predetermined voltage level that is greater than the ground voltage. Also during this phase, SERVICE_NODE can be biased to ground, though this is not required. In phase 403, however, SERVICE_NODE can be left floating. In phase 404, the p-well bulk region and the common source line can be biased to a high erase voltage level.

In phase 405, when the erase pulse terminates, discharge of the p-well bulk region and the common source line can be initiated. In phase 406, discharge of the bit lines can be initiated by connecting the SERVICE_NODE to the ground through a DC (direct current) path. This DC path may includes at least one switch such as a transistor that is tuned ON Discharging by a capacitive coupling may cooperate with the DC discharging path to discharge the SERVICE_NODE and thus the bit lines. Phase 406 can occur at the same time as phase 405 or a predetermined period of time after phase 406. In some embodiments, phase 406 can even begin before phase 405. Additionally, phase 405 can be omitted in some embodiments, and the p-well bulk region can be discharged as a consequence of forward biasing of the p-n contact junction. The operations in phases 405 and 406 will be described in more detail later. In phase 407, discharge can be concluded according to various methods, as described below.

Figure 5:
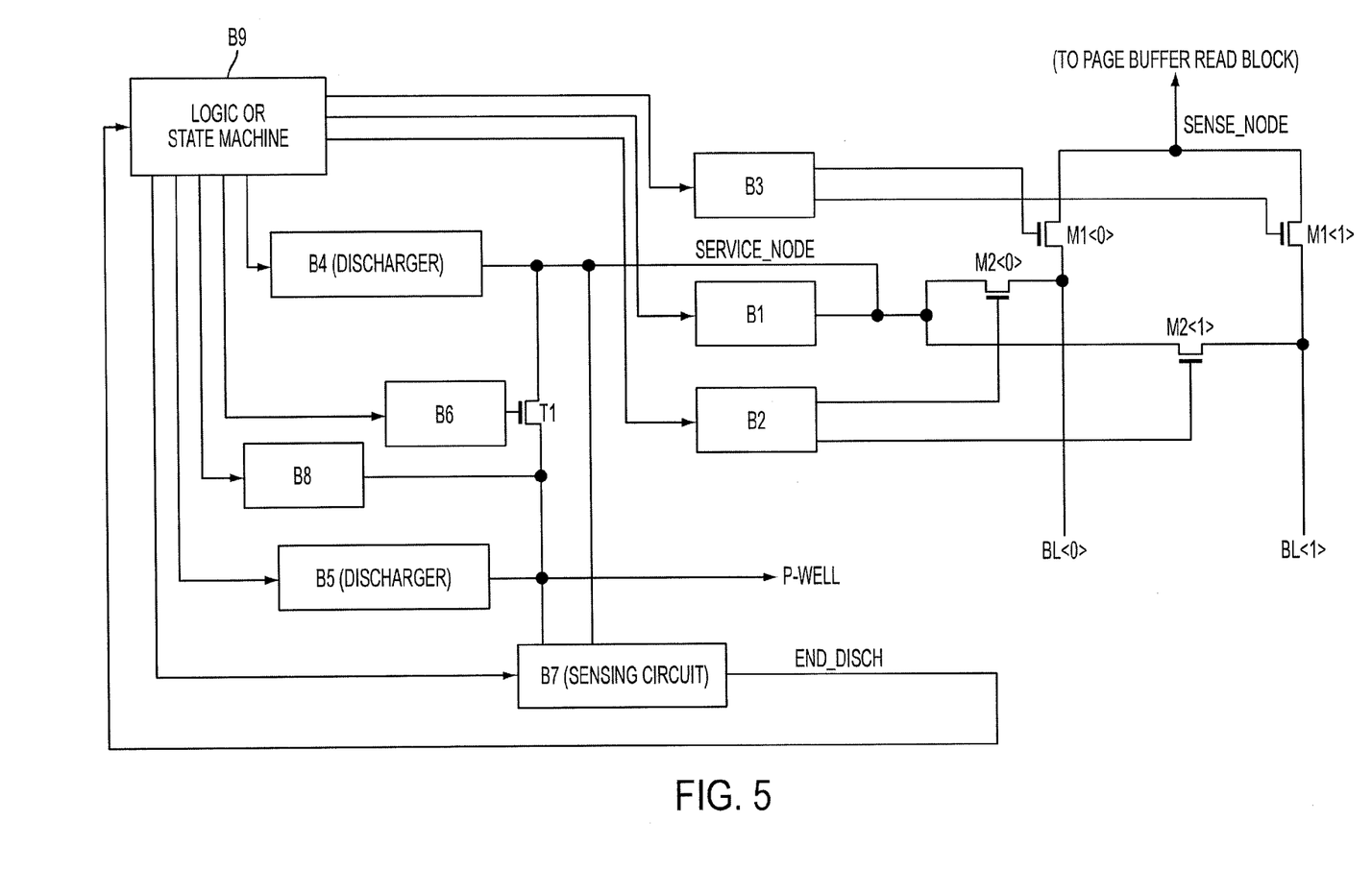
FIG. 5 illustrates an example of a circuit architecture for implementing an erase and discharge method according to an embodiment.

FIG. 5 illustrates an example of circuit architecture for implementing an exemplary erase and discharge method according to an embodiment, such as the method illustrated in FIG. 4. Note that the portion of the circuit serving as an interface between the bit lines and the rest of the circuit is similar to the interface circuit depicted in FIG. 2.

B1, B2, and B3 can be electronic components such as analog switches, regulators, or charge pump circuits. While B1 can be used to deliver a predetermined voltage level to SERVICE_NODE, it is substantially activated in the read, write and verify operations other than the erase operation to leave SERVICE_NODE floating in the erase operation. SERVICE_NODE can be protected against overvoltage due to capacitive coupling. This can be accomplished, for example, using a limiting circuit that prevents SERVICE_NODE from exceeding a predetermined safe voltage level. B2 can be used to deliver an intermediate voltage level to the gates of transistors M2<0> and M2<1> connecting the bit lines to SERVICE_NODE. B3 can be used to deliver ground to the gates of transistors M1<0> and M1<1> connecting the bit lines to SENSE_NODE.

B2 and B3 are depicted as having two outputs. This is because many NAND memories are configured so that the gates of transistors connecting bit lines are grouped into two groups—even and odd. For example, assuming a greater number of bit lines in the circuit of FIG. 5, all the gates of the M1 transistors connecting even bit lines can be shorted together while all the gates of the M1 transistors connecting odd bit lines can be shorted together. A similar connection scheme can be used for the M2 transistors. Accordingly, B2 and B3 are configured to have an output for each group. Nevertheless, the techniques described herein can be applied just as well to other bit line connection schemes, and thus the number of outputs of B2 and B3 can vary.

B4 and B5 can be electronic components such as discharger circuits. B4 can be used to discharge the bit lines as discussed above. B5 can be used to discharge the p-well bulk region and the common source line. In some embodiments, B5 may be omitted. B6 can be an electronic component such as an analog switch and can be used to turn NO or OFF transistor T1 connected between the SERVICE_NODE and the P-well discharging line. B7 can be an electronic component such as a high voltage analog sensing circuit. B7 can be used to sense the voltage level of certain portions of the circuit, in particular of the SERVICE_NODE. In some embodiments, B7 can also sense the voltage level of the P-well discharge line. B8 can be an electronic component such as a circuit including a charge pump and a switch. B8 can be used to deliver to the p-well bulk region a high voltage level as an erase pulse. Logic/state machine B9 can be an electronic component such as a circuit configured to manage and control respective operations of the circuit units B1 to B8, including sending control signals to B1-B8 and receive the END_DISCH signal from B7. The logic/state machine B9 can be programmed, hardwired, or controlled to implement the methods described herein.

As stated above, the exemplary circuit depicted in FIG. 5 can be used to implement the exemplary method of FIG. 4.

During phase 401, B3 can deliver ground to the gates of transistors M1<0> and M1<1> to turn these transistors OFF.

During phase 402, B2 can deliver an intermediate voltage level $V_{int}$ to the gates of transistors M2<0> and M2<1>. As discussed above, B1 can be deactivated during the erase operation including phases 401 to 407 so that the output node thereof, which is connected to SERVICE_NODE, may be brought into to a high impedance state.

In selecting an appropriate value for $V_{int}$, several things may need to be taken into consideration. First, $V_{int}$ should be high enough to allow safe operation of transistors M2<0> and M2<1> during the discharge performed in phase 405. In order to avoid damage, high-voltage nMOS transistors, which can be used for transistors M2<0> and M2<1>, typically have a maximum allowed drain-to-source voltage difference limit $V_{ds}$ when turned on. Thus, if the voltage difference exceeds $V_{ds}$, damage to the transistors could occur. At the same time, bit lines BL<0> and BL<1> are coupled to the erase voltage level $V_{erase}$ during the erase pulse performed in phase 404. Since the value of $V_{erase}$ may be very high, such as 20V or higher, the voltage difference of transistors M2<0> and M2<1> could exceed $V_{ds}$ and thus damage could occur. Accordingly, $V_{int}$ should be selected according to the following relation:

$$V_{int} > (V_{erase}(\text{max}) - V_{ds}(\text{max allowed}) - V_{th}), \text{ where}$$

$V_{int}$ is the voltage to deliver to the gates of transistors M2<0> and M2<1>, $V_{erase}(\text{max})$ is the maximum voltage applied during the erase pulse of phase 404, $V_{ds}(\text{max allowed})$ is the maximum specification for a drain-to-source voltage turn-on difference of the transistors M2<0> and M2<1>, and $V_{th}$ is the threshold voltage of the transistors M2<0> and M2<1>.

Second, $V_{int}$ should not be so high that it damages discharger B4. Thus, $V_{int}$ may have a maximum voltage limit. Note, however, that dischargers often have their own protection solution embedded within the circuit to prevent damage in this type of scenario. For example, the circuit may include cascade resistors or anti-snap-back resistors. Thus, this consideration might not be very important.

Third, of course, $V_{int}$ should be lower than an oxide breakdown voltage of transistors M2<0> and M2<1>. That is, there may be a predetermined maximum voltage associated with these transistors, above which oxide breakdown can occur and damage to the transistors may result.

During phase 403, B4 is ensured to be deactivated, and B7 is connected at a sensing input node thereof to the SERVICE_NODE, so that SERVICE_NODE is left floating.

During phase 404, B8 can deliver a high voltage level $V_{erase}$ as an erase pulse to the p-well bulk region and the common source line. During this phase, bit lines BL<0> and BL<1> can rise to $V_{erase}$ by a capacitive coupling between the p-well and the bit lines as discussed above. Also, SERVICE_NODE rises to a voltage value of about ($V_{int} - V_{th}$), since SERVICE_NODE is left floating.

In the method shown in FIG. 4, during phase 405, after stopping the application of the erase pulse, B5 can be activated to discharge the p-well bulk region and the common source line. (Recall that the p-well bulk region and the common source line can be shorted together.) In an embodiment, phase 405 can be omitted since the p-well bulk region can be discharged as a consequence of forward biasing of the p-n contact junction, which will be discussed in detail later.

During phase 406, which can be performed concurrently with phase 405, the discharger B4 can be activated to discharge the bit lines BL<0> and BL<1> through the path formed by B4 and transistors M2<0> and M2<1>. Particularly, B4 can form a DC path between a ground line (not shown) as a discharging line and the SERVICE_NODE. This DC path may include a switch (not shown) such as transistor that is in a turned-ON state. Thus, the bit lines are discharged not only by means of capacitive coupling but also by the DC path formed in the discharger B4.

In case of the phase 406 being executed after elapsing a predetermined period time from the phase 405, the bit lines may be at first discharged in accordance with discharging the p-well by the capacitive coupling therebetween until phase 406 is initiated, and then further discharged by the discharger B4 in response to the formation of the DC discharging path in the discharger B4.

If phase 405 is omitted, by activating the discharger B4 in phase 406, the voltage at the SERVICE_NODE (and thus on the bit lines) starts to be lowered. As shown in FIG. 3, the bit lines are in contact with the n-type contact region formed in the p-well. Accordingly, when the potential of the n-type contact region is lowered up to such a potential that forwardly biases the PN junction between the N-type region and the p-well, the p-well bulk region can be discharged through the bit-line discharge path due to forward biasing of the p-n contact junction. Thus, in this embodiment, the discharger B4 discharges not only the bit lines but also the P-well bulk region and the common source line.

During the phase of bit-lines discharging, the bit-line voltage (on the drain side of transistors M2<0> and M2<1>) decreases, and the SERVICE_NODE voltage (on the source side of transistors M2<0> and M<1>) sets to ($V_{int} - V_{th}$). At first, as the bit-line voltage is higher than the SERVICE_NODE voltage, transistors M2<0> and M2<1> work in saturation mode, discharging the bit lines BL<0> and BL<1> while the voltage of SERVICE_NODE stays constant at ($V_{int} - V_{th}$). However, when the bit lines reach the voltage value of ($V_{int} - V_{th}$), the transistors enter the triode mode of operation. During triode mode, the voltages of the bit lines and of SERVICE_NODE are equalized and both are discharged toward ground as discharger B4 operates.

During phase 407, discharge can be completed according to the following techniques using sensing circuit B7.

The SERVICE_NODE voltage can be coupled to sensing circuit B7. The sensing circuit can compare the SERVICE_NODE voltage with a predetermined voltage level $V_s$. In an embodiment, $V_s$ can be equal to $V_{cc}$ (the power supply of the memory device that is smaller than the level $V_{erase}$ of the erase pulse). Of course, $V_s$ can be selected to be lower or higher than $V_{cc}$.

When the sensing circuit senses that the SERVICE_NODE voltage falls below $V_s$, the sensing circuit can notify the logic/state machine B9 by asserting an END_DISCH signal. The END_DISCH signal can travel to the logic/state machine B9 through the path depicted in FIG. 5.

In an embodiment, the logic/state machine B9 can end the discharge process upon receiving the END_DISCH signal for the first time. To end the discharge process, the logic/state machine B9 can turn off all the electronic components used during the discharge process. For example, B4, B5, B6, and B7 can all be turned off. Additionally, the logic/state machine B9 can activate pull-down transistors on the node corresponding to the p-well bulk region as well as on SERVICE_NODE in order to fully discharge these portions of the circuit to ground.

In an embodiment, the logic/state machine B9 can perform further testing upon receiving the END_DISCH signal to determine whether the discharge process should be ended. The logic/state machine B9 can enable B6, which turns on transistor T1. P-WELL and SERVICE_NODE can thus be shorted together through transistor T1. (Note that P-WELL is the node including the path between discharger B5 and the p-well bulk region.) This can ensure that both the P-WELL_NODE and the SERVICE_NODE are equalized at the same voltage. Accordingly, the sensing circuit can then compare again the voltage of SERVICE_NODE with $V_s$ to determine whether the voltage is still below $V_s$.

If the p-well bulk region has already been discharged completely, i.e., it is below $V_s$, then the voltage of SERVICE_NODE will still be below $V_s$. In this case, the sensing circuit B7 can continue asserting the END_DISCH signal. This will indicate to the logic/state machine B9 that discharge is complete. The logic/state machine B9 can then end the discharge process, as described above.

Figure 6A:
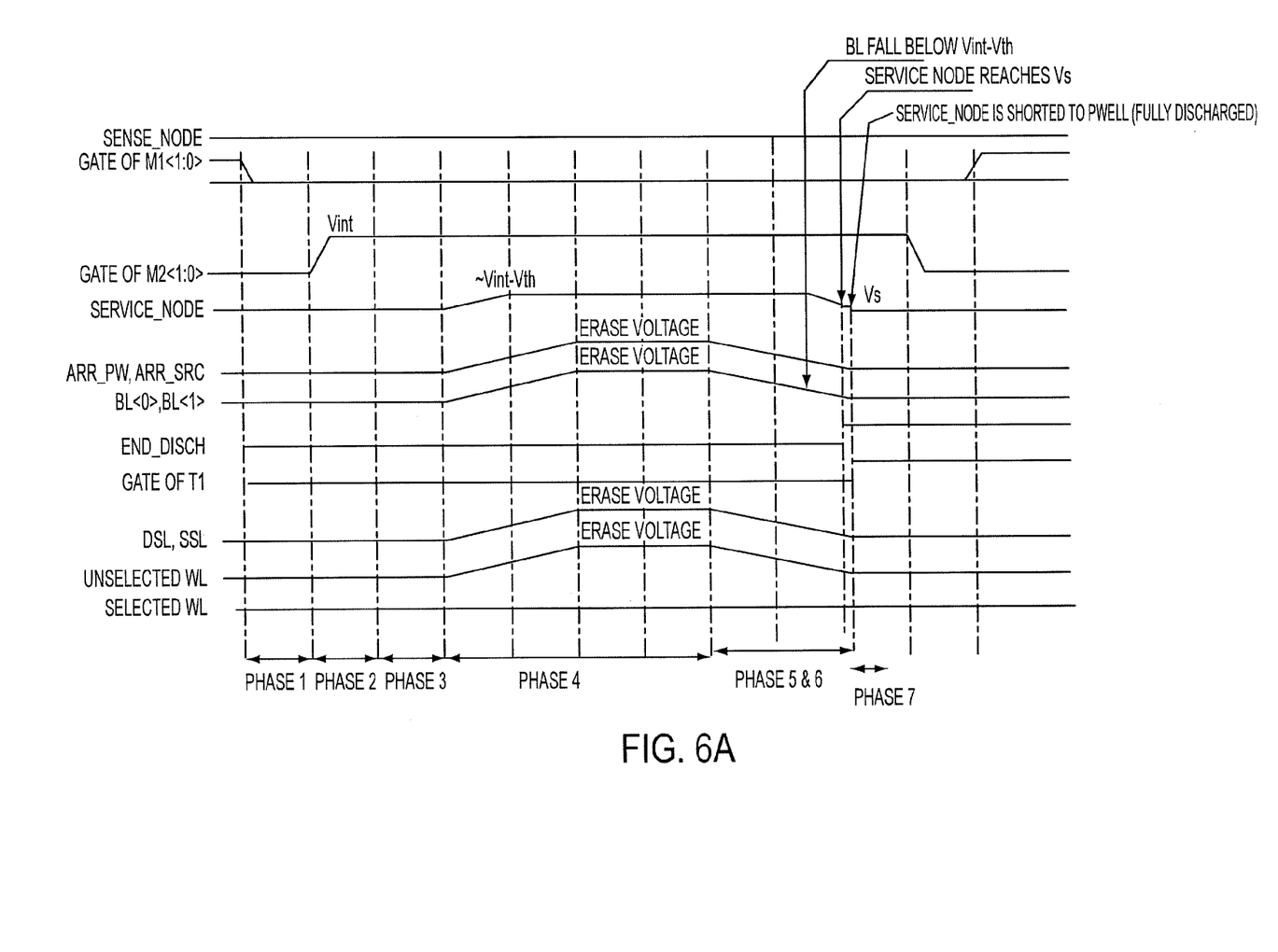
FIG. 6(a) illustrates an exemplary timing diagram for an erase and discharge operation where the p-well bulk region is fully discharged when discharge of the SERVICE_NODE ends, according to an embodiment.

FIG. 6(a) depicts an exemplary timing diagram of the erase and discharge method corresponding to a situation in which the p-well bulk region was fully discharged. Note that FIG. 6(a) indicates a case where phases 405 and 406 are initiated simultaneously, and that phases 1-7 in FIG. 6(a) are intended to correspond to phases 401-407 in FIG. 4, respectively. The further explanations of the operations from phase 1 (phase 401) to phase 4 (phase 404) will be omitted. By the initiation of phases 5 and 6 (phases 405 and 406), the dischargers B4 and B5 are activated to discharge the p-well bulk region and the SERVICE_NODE (and thus the bit lines).

Figure 5A:
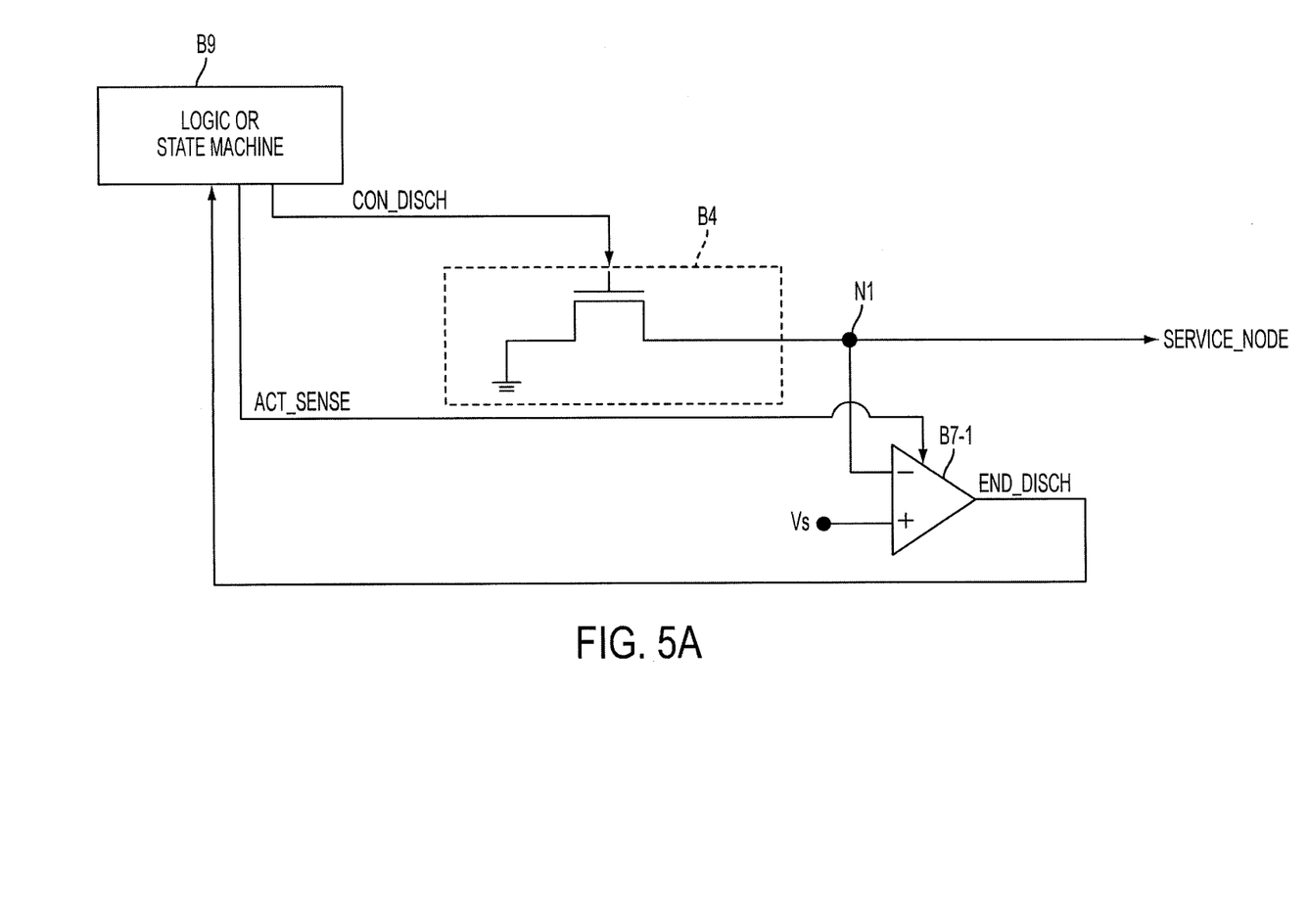
FIG. 5A illustrates an example indicative of a part of circuit blocks B4 and B7 shown in FIG. 5.

Referring now to FIG. 5A, the discharger B4 may include a transistor connected between the SERVICE_NODE and the ground line as a discharging line. This transistor is turned ON in response to the activation of B4, so that a DC path through the turned-ON transistor is formed between the SERVICE_NODE and the ground. It should be noted that the discharger B4 shown in FIG. 5A is just basic structure and thus an actual constitution may be more complicated. For example, one or more protection resistors may be connected in series to the drain of the discharger transistor, and/or two or more cascading transistors are used as the discharging transistor.

Turning back to FIG. 6(a), at the point that the bit-line voltage falls below $(V_{int}-V_{th})$, the SERVICE_NODE voltage also begins to fall. This voltage is sensed or compared with the Vs by a comparator B7-1 in the sensing circuit B7. See FIG. 5A. When the SERVICE_NODE voltage reaches $V_s$, the comparator B7-1 changes its output END_DISCH from L to H, and this change is supplies to B9. In response thereto, B9 deactivates B4 to turn OFF the transistor in the discharger B4 and activates B6 to turn the transistor T1 ON. The discharge process for the bit lines temporarily ends as the SERVICE_NODE voltage remaining below $V_s$ (phase 407).

Figure 6B:
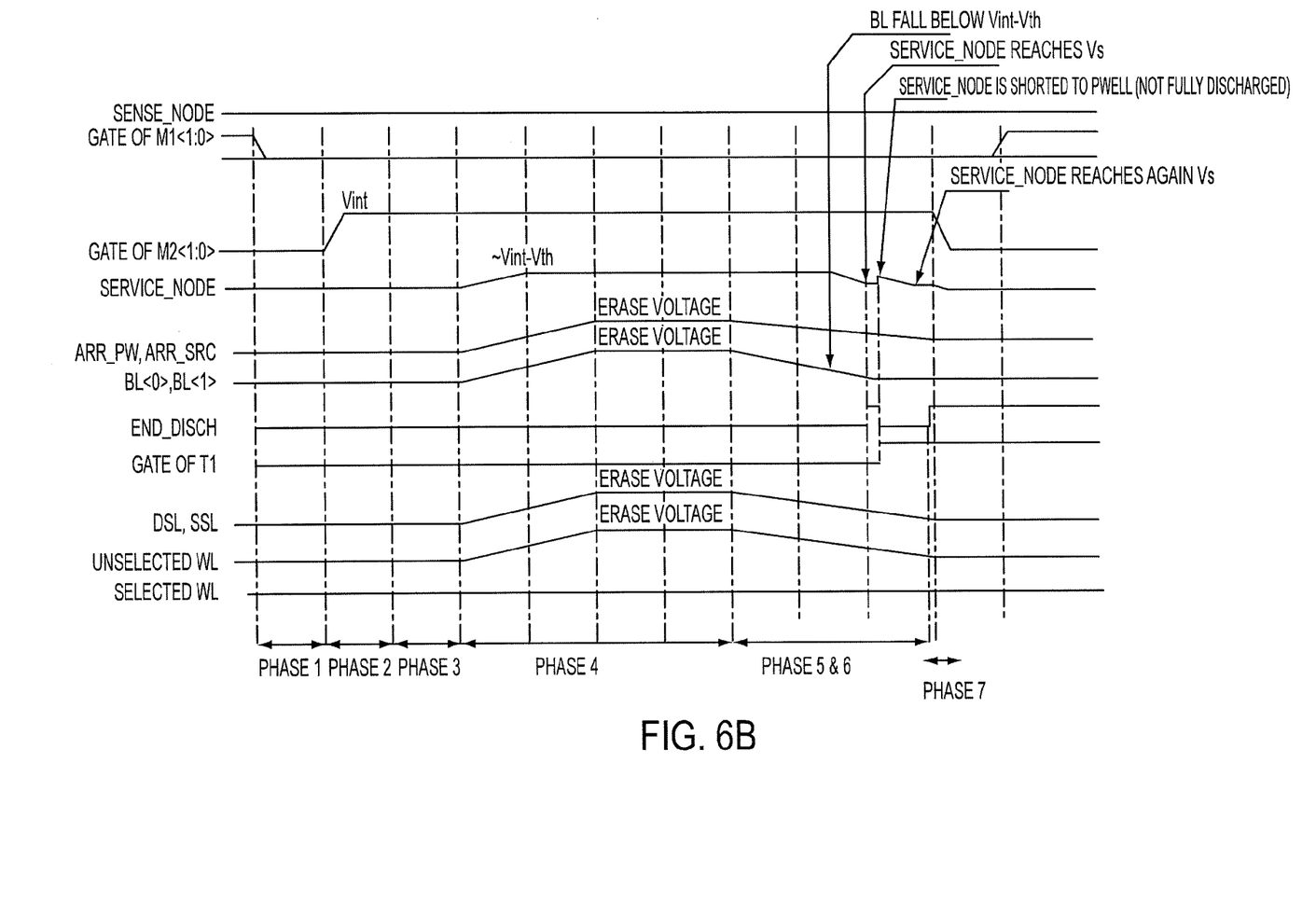
FIG. 6(b) illustrates another exemplary timing diagram for an erase and discharge operation where the p-well bulk region is not completely discharged when discharge of the SERVICE_NODE ends, according to an embodiment.

However, if the p-well bulk region has not been discharged completely, i.e., it is above $V_s$, at time when the END_DISCH signal is changed to H, as shown in FIG. 6(b), then the voltage of SERVICE_NODE will now be come back to be higher than $V_s$ due to a charge sharing effect as a result of the short of the SERVICE_NODE and the p-well by the transistor T1. In this case, the END_DISCH signal can be driven to low again by the sensing circuit B7. This will indicate to the logic-state machine B9 that discharge is not completed. The logic/state machine B9 can then decide to keep the electronic components involved in the discharge process on until the SERVICE_NODE falls below $V_s$ again. For this purpose, B9 activates B4 again to form the DC discharging path between SERVICE_NODE and the ground. At this time, if the p-well discharger B5 has been already deactivated, B9 can activate B5 again to resume discharging the P-well and the common source node. By these operations, both the p-well bulk region and the bit lines should be below $V_s$. The END_DISCH signal is thus changed again from L to H, by which the logic/state machine B9 can then decide to end the discharge process. The phases 5 and 6 in this situation are thus prolonged as shown in FIG. 6(b).

Figure 5B:
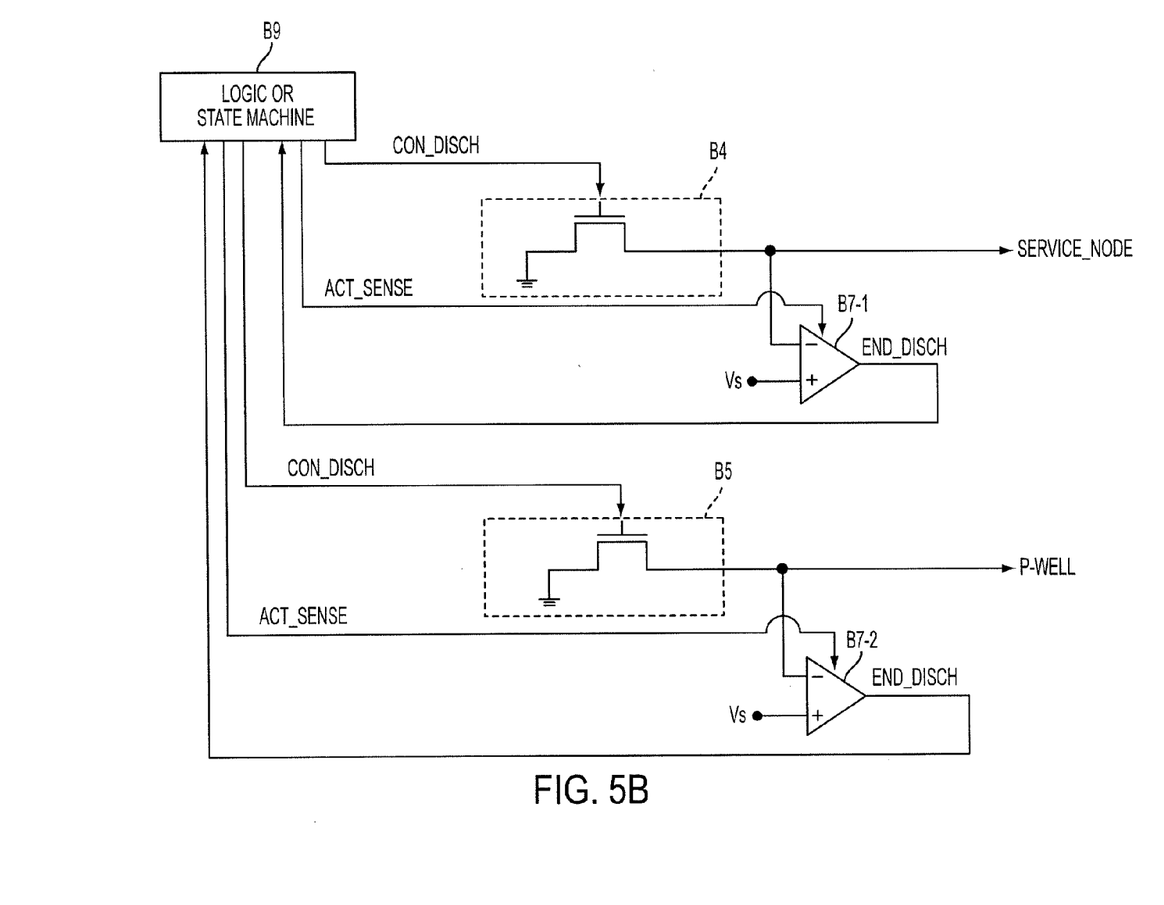
FIG. 5B illustrates another example indicative of a part of circuit blocks B4 and B7 shown in FIG. 5.

In an embodiment, the sensing circuit B7 can be coupled to P-WELL, that is, the node including the path between discharger B5 and the p-well bulk region. B7 may therefore include, as shown in FIG. 5B, a second comparator B7-2 that compares the voltage of the P-well discharge line with the reference voltage Vs. The output of the comparator B7-2 is supplied to the B9 as another END_DISCH signal that takes the high level (H) when the voltage of the P-well discharge line reaches the Vs level. FIG. 5B further shows that the discharger B5 may include a transistor that is connected between P-WELL and the ground line as a discharging line to discharge the p-well. This transistor is turned ON by the activation of B5, so that a DC path through the transistor is formed between the P-WELL and the ground. It should be noted that each of the dischargers B4 and B5 shown in FIG. 5B is just basic structure and thus an actual constitution may be more complicated. For example, one or more protection resistors may be connected in series to the drain of the discharger transistor, and/or two or more cascading transistors are used as the discharging transistor. Thus, B9 can control the discharger B5 independently of the discharger B4, so that the discharger B5 can be continued to be activated until the voltage of the p-well discharge lines (i.e., the p-well bulk region and the common source line) is lowered up to the Vs level, By this circuit configuration, the phase 6 in FIG. 6(b) can be shortened.

Figure 6C:
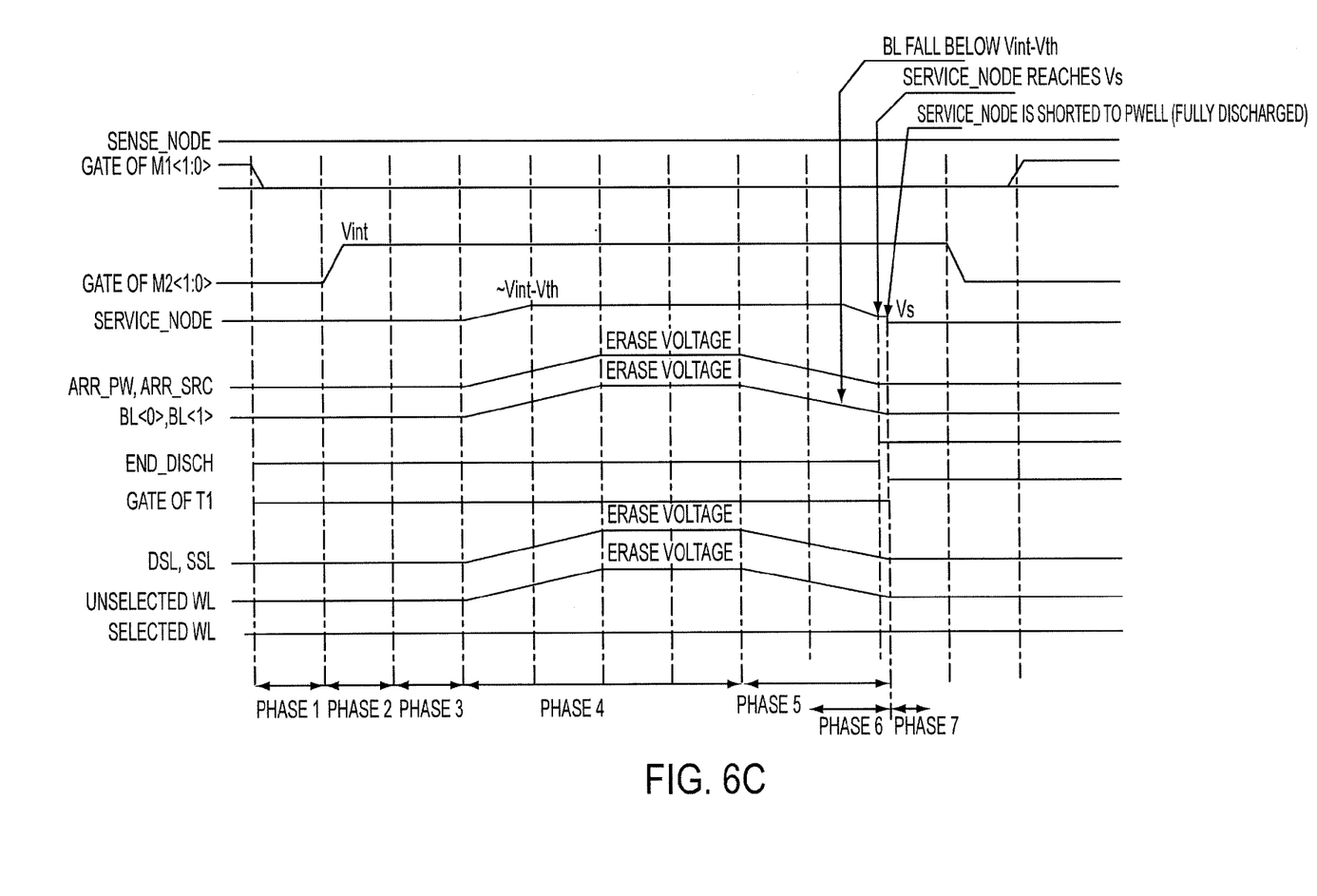
FIG. 6(c) illustrates still another exemplary timing diagram for an erase and discharge operation where the p-well bulk region is fully discharged when discharge of the SERVICE_NODE ends, according to an embodiment.

In another embodiment, phase 406 can be initiated after elapsing a predetermined time period from the initiation of phase 405. In this case, a timing chart shown in FIG. 6(c) is derived. Differently from the case of FIG. 6(a), during phase 5 (phase 405), since the discharger B4 has not been activated yet, the bit lines are discharged due to the capacitive coupling between the bit lines and the p-well in accordance with discharging the p-well. By the initiation of phase 6 (phase 406), the discharger B4 is activated to discharge the SERVICE_NODE (and thus the bit lines).

Figure 6D:
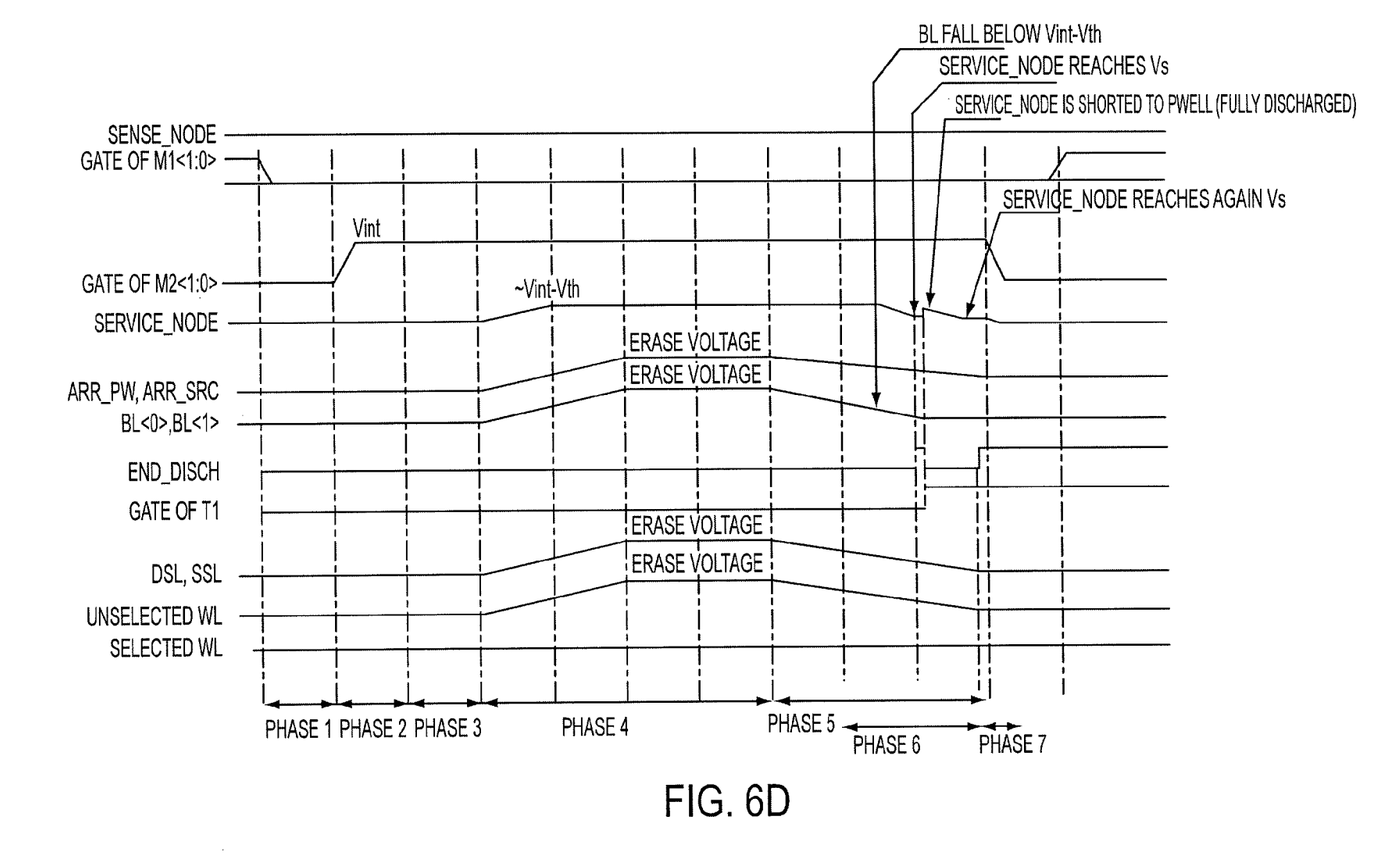
FIG. 6(d) illustrates still another exemplary timing diagram for an erase and discharge operation where the p-well bulk region is not completely discharged when discharge of the SERVICE_NODE ends, according to an embodiment.

Also in this case, if the p-well bulk region has not been discharged completely, the phases 5 and 6 are prolonged as shown in FIG. 6(d). The discharge process for the p-well bulk and the bit lines finally ends as the SERVICE_NODE remaining below Vs.

Figure 7:
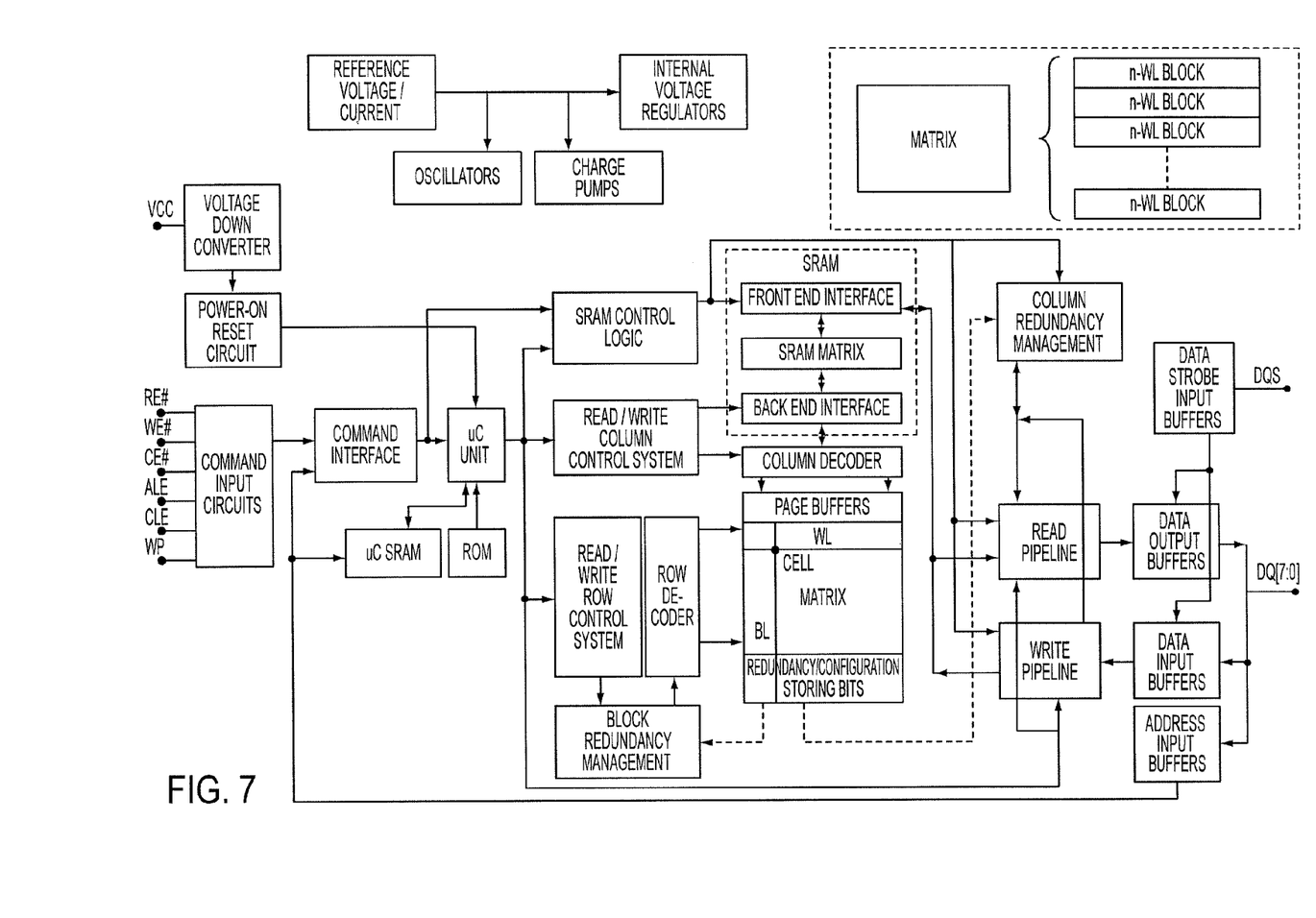
FIG. 7 illustrates various components of an exemplary NAND flash memory.

FIG. 7 illustrates various components of an exemplary NAND flash memory. One of ordinary skill in the art can understand how the various components function and are interrelated. One of ordinary skill in the art can understand how to implement the disclosed techniques and circuits in a flash memory such as is disclosed in this figure. In particular, implementation of the disclosed techniques and circuits can involve the uC unit, the COLUMN decoder, the PAGE BUFFERS, and the MATRIX.

Methods and circuits to achieve better discharge of bit lines after an erase pulse in a memory have been described, as well as sensing techniques to determine when both the bit-line voltage and the p-well bulk region voltage are below a desired low voltage level. By virtue of these methods, circuits, and techniques, bit-line discharge can continue, even after p-well discharge ends, up to a desired low value voltage that can be as close to ground as desired. Additionally, an efficient bit-line discharge can be achieved even when multiple word lines or strings are erased simultaneously. Moreover, discharging the bit lines together with the p-well bulk region of the matrix array can protect against the possibility of triggering junction breakdown and can avoid reliability issues due to a weak coupling effect between the p-well bulk region and the bit lines. Furthermore, word-line discharge for the erase-inhibited strings can be improved.

One skilled in the relevant art will recognize that many possible modifications and combinations of the disclosed embodiments can be used, while still employing the same basic underlying mechanisms and methodologies. The foregoing description, for purposes of explanation, has been written with references to specific embodiments. However, the illustrative discussions above are not intended to be exhaustive or to limit the disclosure to the precise forms disclosed. Many modifications and variations can be possible in view of the above teachings. The embodiments were chosen and described to explain the principles of the disclosure and their practical applications, and to enable others skilled in the art to utilize the disclosure and various embodiments with various modifications as suited to the particular use contemplated.

Furthermore, while this specification contains many specifics, these should not be construed as limitations on the scope of what is being claimed or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A method comprising:
   erasing multiple cells in a memory device,
   discharging a semiconductor well of a first conduction type and a source line associated with the multiple cells through a first discharge path using a first discharger circuit,
   discharging a bit line associated with the multiple cells through a second discharge path using a second discharger circuit, and
   determining whether a voltage of the second discharge path is lower than a predetermined voltage using a sensing circuit.

2. The method of claim 1, comprising:
   ending the discharge steps when it is determined that the voltage of the second discharge path is lower than the predetermined voltage.

3. The method of claim 1, comprising:
   shorting the second discharge path with the first discharge path when it is determined that the voltage of the second discharge path is lower than the predetermined voltage, and
   after shorting the second discharge path with the first discharge path, determining whether the voltage of the second discharge path is lower than the predetermined voltage using the sensing circuit.

4. The method of claim 3, comprising:
   ending the discharge steps when it is determined that the voltage of the second discharge path is lower than the predetermined voltage after shorting the second discharge path with the first discharge path.

5. The method of claim 3, comprising:
   continuing the discharge steps until it is determined that the voltage of the second discharge path is lower than the predetermined voltage after shorting the second discharge path with the first discharge path.

6. The method of claim 1, wherein the sensing circuit is a first sensing circuit, the method comprising:
   determining whether a voltage of the first discharge path is lower than a predetermined voltage using a second sensing circuit, and
   ending the discharge steps when it is determined that the voltage of the first discharge path and the voltage of the second discharge path are each lower than the predetermined voltage.

7. The method of claim 1, comprising:
   determining whether a voltage of the first discharge path is lower than a predetermined voltage using a sensing circuit,
   shorting the first discharge path with the second discharge path,
   after shorting the first discharge path with the second discharge path, determining whether the voltage of the first discharge path is lower than the predetermined voltage using the sensing circuit, and
   ending the discharge steps when it is determined that the voltage of the first discharge path is lower than the predetermined voltage after shorting the first discharge path with the second discharge path.

8. The method of claim 1, wherein the discharging steps are performed simultaneously.

9. The method of claim 1, wherein the well of the first conduction type comprises a p-well bulk region and wherein the bit lines are also discharged through capacitive coupling with the p-well bulk region.

10. A method comprising:
    driving, to an intermediate voltage, a gate of at least one transistor connecting multiple bit-lines to a common node that is left floating during application of an erase pulse to a bulk region common to the multiple memory cells;
    enabling a bit-line discharge path by activating a discharger circuit connected to the common node in response to removal of the erase pulse; and
    allowing bit-line discharge to continue, independently of whether the bulk region stops discharging, until the common node voltage is below a desired value.

11. The method of claim 10, comprising:
    sensing when at least one of the common node voltage and the bulk region voltage is below a desired voltage level.

12. The method of claim 10, wherein the bit-lines are fully dischargeable to substantially ground potential.

13. The method of claim 10, wherein the at least one transistor comprises a high voltage NMOS transistor.

14. The method of claim 10, wherein the bulk region comprises a p-well.

15. A method comprising:
performing an erase operation on multiple cells in a memory device,
the performing comprising:
applying an erase voltage to the multiple cells, bit lines coupled to the multiple cells being thereby charged up,
discharging the bit lines by coupling the bit lines to a discharging line through a DC path,
discharging a bulk region in which the multiple cells are formed by coupling the bulk region to the discharging line, and
electrically connecting the bulk region and the bit lines to each other when a potential on the bit lines reaches a predetermined level.

16. The method of claim 15, comprising:
stopping the discharging the bit lines when the potential on the bit lines reaches the predetermined level and resuming the discharging the bit lines in case of the potential of the bit lines becomes larger than the predetermined level due to electrically connecting the bit lines and the bulk region to each other.

17. The method of claim 15, comprising:
discharging a bulk region in which the multiple cells and a contact region for the bit lines are formed by forwardly biasing a p-n junction between the bulk region and the contact region in response to the discharging the bit lines.

18. The method of claim 15, wherein the discharging the bit lines and the discharging the bulk region are carried out simultaneously with each other.

19. The method of claim 15, wherein the discharging the bit lines is carried out after the discharging the bulk region.

20. A device comprising:
a non-volatile memory array including a plurality of cells;
an erase circuit erasing data from the cells;
a first discharger circuit discharging a bit line associated with the cells;
a first sensing circuit supplying a first level of a first signal while a voltage level of the bit line is on or above a first voltage and supplying a second level of the first signal while the voltage level of the bit line is below the first voltage; and
a control circuit deactivating the first discharger circuit in response to receiving the second level of the first signal supplied from the first sensing circuit, to finish the discharging of the bit line which has been charged up by the erasing of the erase circuit.

21. The device of claim 20, comprising:
a second discharger circuit discharging a semiconductor well associated with the cells, and
wherein the control circuit deactivates the second discharger circuit in response to receiving the second level of the first signal supplied from the first sense circuit, to finish the discharging of the semiconductor well which has been charged up by the erasing of the erase circuit.

22. The device of claim 20, comprising:
a second discharger circuit discharging a semiconductor well associated with the cells, and
a second sense circuit supplying a first level of a second signal while a voltage level of the semiconductor well is on or above a second voltage and supplying a second level of the second signal while the voltage level of the semiconductor well is below the second voltage; and
wherein the control circuit deactivates the second discharger circuit in response to receiving the second level of the second signal supplied from the second sensing circuit, to finish the discharging of the semiconductor well which has been charged up by the erasing of the erase circuit.

23. The device of claim 20, comprising:
a switch circuit coupled between a first path connected to the bit line and a second path connected to the semiconductor well, the first and second paths being electrically connected each other when the switch circuit is activated and electrically disconnected each other when the switch circuit is deactivated; and
wherein the control circuit activates the switch circuit in response to receiving the second level of the second signal supplied from the second sensing circuit.

24. The device of claim 20, wherein the first voltage is power supply of the device.

* * * * *